United States Patent
Stephens et al.

(10) Patent No.: US 9,445,491 B2
(45) Date of Patent: Sep. 13, 2016

(54) OVERPASS GROUNDING SPRING AND INTEGRATED COMPONENT PROTECTION

(71) Applicant: Apple Inc., Cupertino, CA (US)

(72) Inventors: Gregory N. Stephens, Sunnyvale, CA (US); Matthew D. Hill, Santa Clara, CA (US); Scott A. Myers, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 135 days.

(21) Appl. No.: 14/231,372

(22) Filed: Mar. 31, 2014

(65) Prior Publication Data

US 2015/0064937 A1 Mar. 5, 2015

Related U.S. Application Data

(60) Provisional application No. 61/873,737, filed on Sep. 4, 2013.

(51) Int. Cl.
| | |
|---|---|
| *H01R 4/66* | (2006.01) |
| *H05K 1/02* | (2006.01) |
| *H01R 12/57* | (2011.01) |
| *H01R 4/64* | (2006.01) |

(52) U.S. Cl.
CPC ............ *H05K 1/0215* (2013.01); *H01R 12/57* (2013.01); *H01R 4/64* (2013.01); *H01R 2201/06* (2013.01); *H05K 2201/10265* (2013.01); *Y10T 29/4913* (2015.01)

(58) Field of Classification Search
CPC .... H01R 4/64; H01R 4/66; H01R 13/65802; H01R 12/57

USPC .................................................. 439/92, 876
See application file for complete search history.

(56) References Cited

U.S. PATENT DOCUMENTS

| | | | | |
|---|---|---|---|---|
| 5,241,219 | A | * | 8/1993 | LeBaron ............ H01R 13/6633 307/104 |
| 6,149,443 | A | | 11/2000 | Moran |
| 6,276,944 | B1 | * | 8/2001 | Klatt .................... G06K 7/0021 439/638 |
| 6,456,504 | B1 | * | 9/2002 | LoForte ............... H05K 5/0269 361/737 |
| 6,896,527 | B1 | * | 5/2005 | Peng .................. H01R 13/6585 439/108 |
| 7,524,196 | B2 | * | 4/2009 | Bond ...................... H05K 7/12 24/457 |
| 2007/0090502 | A1 | * | 4/2007 | Zhao ................... H01L 23/3128 257/675 |
| 2011/0306252 | A1 | | 12/2011 | Chen et al. |

OTHER PUBLICATIONS

Spring Fingers Overview. TE Connectivity. 2013. Retrieved Apr. 4, 2014 from http://www.te.com/catalog/minf/en/826.

* cited by examiner

*Primary Examiner* — Hien Vu
(74) *Attorney, Agent, or Firm* — Downey Brand LLP

(57) ABSTRACT

The described embodiments relate generally to use of an electrically conductive member, such as a grounding spring, used to electrically ground components on a printed circuit board as well as provide mechanical protection to the components. More particularly, a method and apparatus for attaching a grounding spring to multiple locations on the printed circuit board are disclosed. In one embodiment, the grounding spring can act as both a ground and a mechanical protection element for other surface mounted components disposed on the printed circuit board.

17 Claims, 4 Drawing Sheets

OVERPASS GROUNDING SPRING AND INTEGRATED COMPONENT PROTECTION

CROSS-REFERENCE TO RELATED APPLICATION(S)

This application claims the benefit of priority under 35 U.S.C §119(e) to U.S. Provisional Application No. 61/873,737, filed on Sep. 4, 2013, the disclosure of which is incorporated herein by reference in its entirety.

FIELD

The described embodiments relate generally to overpass grounding components on a printed circuit board. In particular, a method and apparatus for coupling a grounding spring to multiple locations on the printed circuit board are disclosed.

BACKGROUND

As electronic devices are made increasingly smaller, internal components with the devices have increasingly less space in their respective device housings. Consequently, printed circuit board space is put at an increasingly high premium. In certain situations, there may not be space to install a solder pad having enough surface area to robustly couple with a grounding spring. Unfortunately, this can prevent device makers from including certain functionality or in some cases can be a constraint preventing smaller form factor device housings.

Therefore, what is desired is a reliable way to attach a ground spring to a printed circuit board having a constrained amount of space available.

SUMMARY

In one aspect, an electrically conductive connector is described. The electrically conductive connector may include a first second electrically conductive portion, second electrically conductive portion, and an overpass structure. The first electrically conductive portion and second electrically conductive portion may traverse along a PCB at or near a surface of corresponding portions of the PCB. The overpass structure may include an elevated portion formed of electrically conductive material that electrically connects the first and second portion and that overpasses another corresponding portion of the PCB.

In another aspect, a method of grounding a circuit board and protecting a plurality of components on a PCB is described. The method may include attaching an electrically conductive member to a first portion, a second portion, and a third portion. The method may further include attaching the first portion to a top surface of the PCB. The first portion may be electrically connected a first component of the PCB. The method may further include extending the second portion over a top surface of a second component of the PCB. The second component may extend above the top surface of the PCB, and the second portion may be free of connection to the PCB. The method may further include attaching the third portion to a lateral surface of the PCB. The third portion may be electrically connected a third component of the PCB.

In another aspect, a PCB is described. The PCB may include a first component electrically connected to the PCB, a second component electrically connected to the PCB, and a third component electrically connected to the PCB. The PCB may also include an electrically conducting member. The an electrically conducting member may include a first connector portion electrically connected to the first component, a second connector electrically connected to the second component, an overpass portion that extends over and above the third component. The overpass portion may be free of electrical connection to the third component.

Other systems, methods, features and advantages of the embodiments will be, or will become, apparent to one of ordinary skill in the art upon examination of the following figures and detailed description. It is intended that all such additional systems, methods, features and advantages be included within this description and this summary, be within the scope of the embodiments, and be protected by the following claims.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1A:
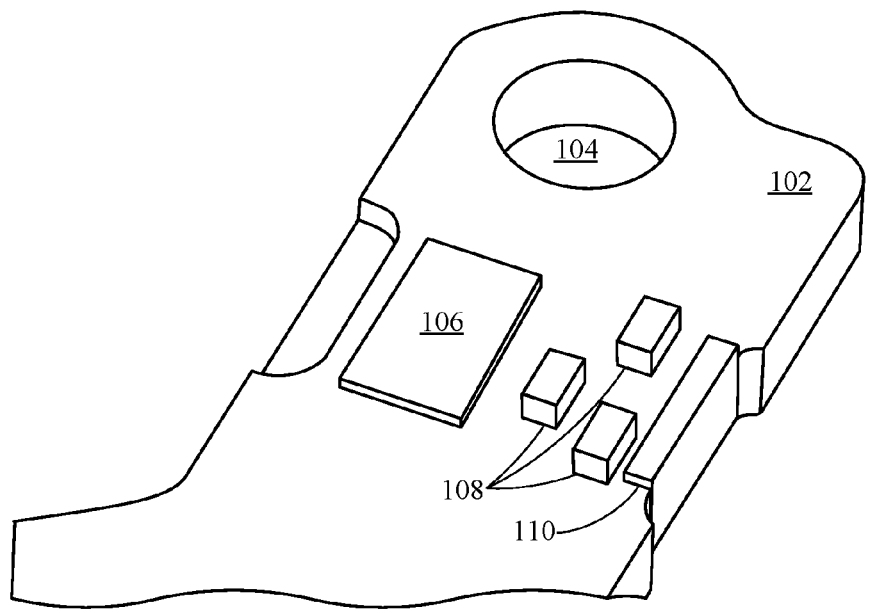
FIG. 1A shows a portion of a printed circuit board having a number of surface mounted components.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

A rounding spring may be utilized to provide an electrically conductive grounding path to components disposed within an electronic device housing, thereby dissipating a charge from a component that is electrically connected to the grounding spring. Grounding these components to chassis ground can help to electrically isolate the components and provide increased protection against electrical shock. In some embodiments, the grounding can also help to reduce electromagnetic interference between proximate components. A grounding spring can also be surface mounted to a printed circuit board (PCB) to provide a grounding path to components on the PCB. However, adhesion of the grounding spring to the printed circuit board can require a minimum amount of surface area to robustly couple the grounding spring to the PCB. When that minimal amount of surface area is unavailable, other attachment means can be required for robust adhesion. One solution to this problem is to use multiple attachment points to secure the grounding spring to the printed circuit board. Between the two attachment points the grounding spring can have the attachment area necessary to securely solder the grounding spring to the PCB. The grounding spring can be formed from various conductive metals including copper or stainless steel. In one embodiment, the grounding spring can be a plated steel strip that has undergone a cold rolling process. The strip can have a thickness of about 0.10-0.15 mm. Plating means may include nickel or tin.

In some embodiments, multi-point attachment of a grounding spring can have additional advantages including component protection. For example, a portion of the grounding spring disposed between the attachment points can pass over other surface mounted components on the PCB, thereby providing an amount of protection to the surface mounted components during a component assembly process. In another embodiment, the grounding spring can cooperate with shielding walls to provide an amount of RF shielding to the overpassed components.

These and other embodiments are discussed below with reference to FIGS. 1-4. However, those skilled in the art will readily appreciate that the detailed description given herein with respect to these figures is for explanatory purposes only and should not be construed as limiting.

FIG. 1A shows a perspective view of a printed circuit board (PCB) 102. PCB 102 can be a main logic board (MLB) for a portable electronic device and can be attached to the portable electronic device by at least a fastener disposed through opening 104. A solder pad 106 can be attached to a top surface of PCB 102. Solder pad 106 can be in electrical communication with various electronic components disposed on PCB 102 and can be used, in conjunction with grounding spring 112 (shown in FIG. 1B), for grounding various electrical components disposed on PCB 102. PCB 102 can also include a number of surface mounted components 108 proximate to solder pad 106. A location of surface mounted components 108 can limit a size of solder pad 106 on PCB 102 as each of surface mounted components 108 along with associated electrical trace routing take up space on PCB 102 that in many cases cannot be overlapped by solder pad 106. PCB 102 can also include edge plate 110 disposed on a lateral (or vertical) surface of PCB 102. Edge plate 110 can be operable to route signals between a top and bottom surface of PCB 102. Edge plate 110 can also be utilized in conjunction with grounding spring 112 to ground electronic components of PCB 102.

Figure 1B:
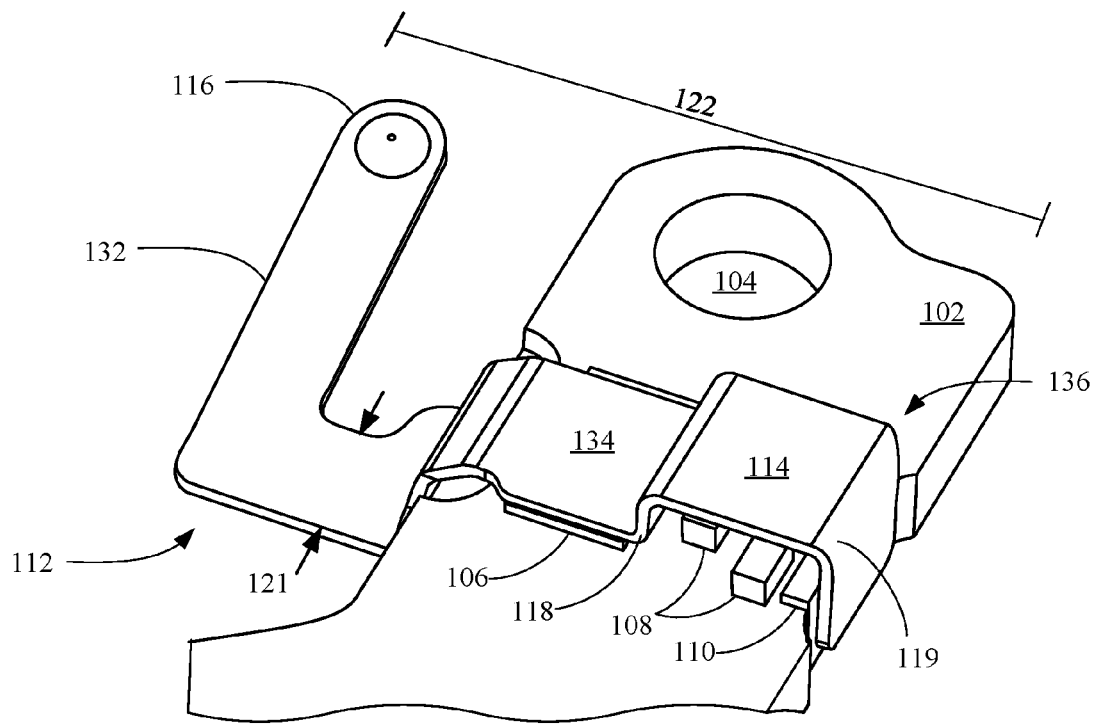
FIG. 1B shows an overpass grounding spring coupled to the printed circuit board of FIG. 1A.
Figure 2:
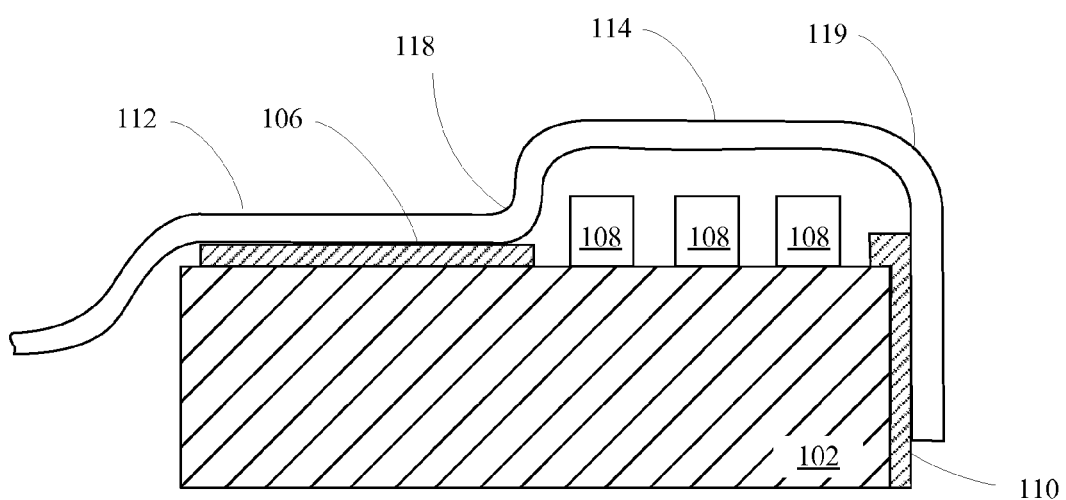
FIG. 2 shows a cross-sectional side view of the printed circuit board of FIG. 1B.

FIG. 1B shows how an overpass grounding spring can be mechanically and electrically coupled to PCB 102 at both solder pad 106 and edge plate 110. In one embodiment, grounding spring 112 can be about 0.10-0.15 mm thick and be formed of cold rolled, plated steel, giving it high flexibility and strength. Grounding spring 112 further includes grounding contact 116 on a first portion 132 of grounding spring 112 that is flexibly connected to a ground chassis (not shown). As shown in FIG. 1B, grounding contact 116 is generally round. However, in other embodiments, grounding contact 116 can have many different shapes or configurations that allow it to conform to a geometry of a housing or other component with which it is designed to be in contact.

An external downward force may be applied to an area generally near grounding contact 116. Consequently, a resultant upward force can be generated to a top surface of solder pad 106 causing grounding spring 112 to detach from solder pad 106 at or near second portion 134 of grounding spring 112. However, in this embodiment shown in FIG. 1B, by extending grounding spring 112 above surface mounted components 108, grounding spring 112 can also be coupled with edge plate 110 to provide additional strength against any forces acting on the grounding spring near grounding contact 116. In addition, grounding spring 112 can provide an electrically conductive grounding path to two separate portions of PCB 102 without adversely affecting surface mounted components 108. In other embodiments, at least some surface mounted components 108 can be electrically isolated from the electrically conductive grounding path formed by grounding spring 112. In addition to providing two grounding points for PCB 102, grounding spring 112 also includes overpass portion 114, corresponding to third portion 136 of grounding spring 112, which substantially covers surface mounted components 108. Overpass portion 114 can prevent surface mounted components 108 from being disturbed during assembly of other components. It should be noted that in some configurations grounding spring 112 can be configured to contact three or more positions on PCB 102, or in other configurations can extend between two separate PCBs. Also, as can be seen in FIG. 1B, first portion 132 is at a level different from second portion 134, and vice versa. Also, as can been seen in FIG. 1B, third portion 136 is a level different from first portion 132 and different from second portion 134. Accordingly, first portion 132 is not planar with respect to second portion 134, and vice versa, and third portion 136 is not planar with respect to first portion 132 and with respect to second portion 134.

The flexibility of grounding spring 112 allows grounding spring 112 to include a first joint 118 disposed between a portion of grounding spring 112 attached to solder pad 106 and overpass portion 114. The external downward force exerted on grounding spring 112, causing an upward force near first joint 118, may be passed through first joint 118 and overpass portion 114. Also, grounding spring 112 further includes a second joint 119 disposed between overpass portion 114 and a portion of grounding spring 112 attached to edge plate 110. Additional forces that may otherwise cause grounding spring 112 to release from PCB 102 may further pass through second joint 119 and onto additional material of grounding spring 112.

As shown in FIG. 1B, grounding spring 112 generally has a width 121 configured to provide a mechanical shield for components located below overpass portion 114. In some embodiments, grounding spring 112 may be wider to mechanically shield additional components. In other embodiments, grounding spring 112 may be narrower to mechanically shield fewer components. Still, in other embodiment, the width of grounding spring 112 may be configured to offset downward forces on grounding contact 116 to ensure grounding spring 112 does not detach from PCB 102 at any location.

Grounding spring 112 generally extends a length 122 from grounding contact 116 and from one end of PCB 102 to another end of PCB 102. In some embodiments, length 122 may be longer to accommodate a longer (or wider) PCB 102 and/or to extend grounding contact 116 further from PCB 102. In other embodiments, length 122 may be shorter in order to engage a smaller PCB 102.

FIG. 2A shows a cross-sectional view of PCB 102 and grounding spring 112. Here, it can be seen that grounding spring 112 passes substantially above surface mounted components 108. In some embodiments, surface mounted components 108 can be electrically grounded through either solder pad 106 or edge plate 110. In other embodiments, surface mounted components 108 can be grounded through other pathways not depicted. For example, grounding spring 112 can be in direct contact with at least one of surface mounted components 108. In such a configuration, the contacted surface mounted component can be coupled to overpass portion 114 by a grounding point configured to direct current along grounding spring 112.

Figure 3:
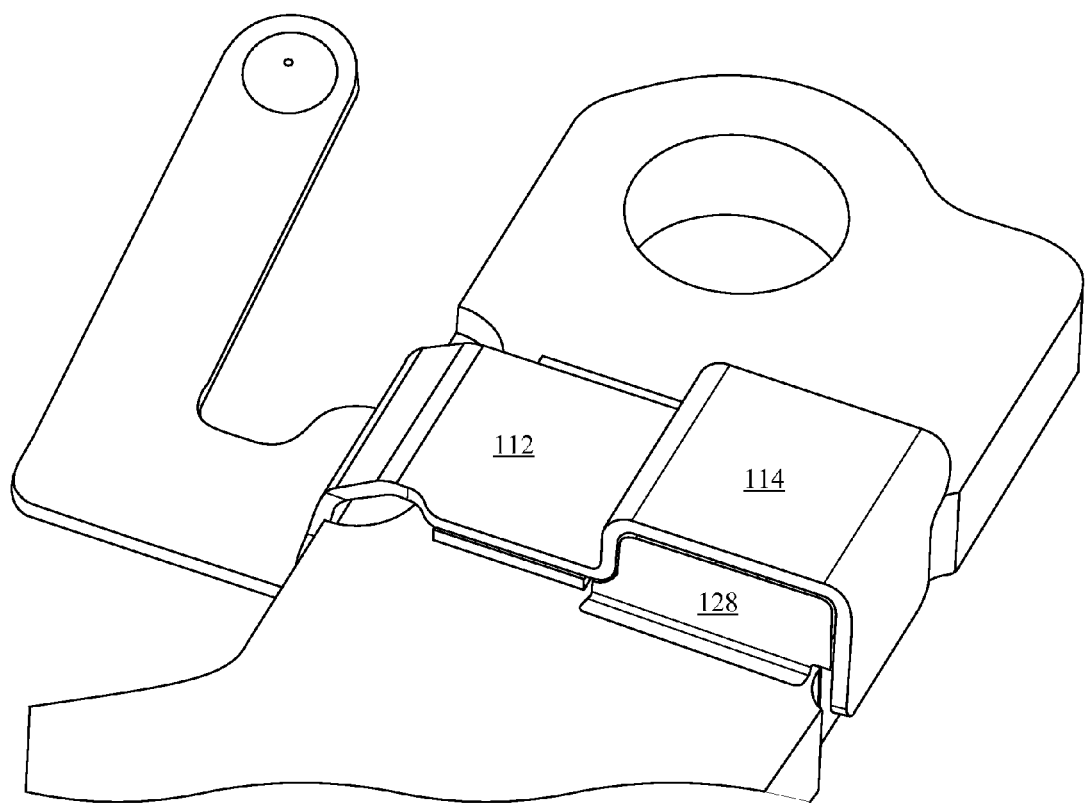
FIG. 3 shows the printed circuit board of FIG. 1B with shielding components configured to provide radio frequency shielding for a number of surface mounted components.

FIG. 3 shows another cross-sectional view of PCB 102. In this depiction additional side shield 128 has been added to enclose surface mounted components 108 (not shown). Side shield 128 can be metal shielding capable of obscuring or completely blocking radio frequency emissions from affecting other proximate electronics. An additional side shield 118 can be disposed on an opposite side of overpass portion 114 so that surface mounted components 108 are completely surrounded by shielding elements. Because grounding spring 112 is also radio opaque, interference can also be prevented from escaping through grounding spring 112. Side shield 128 further offers protection to surface mounted components 108 during a component assembly process.

Figure 4:
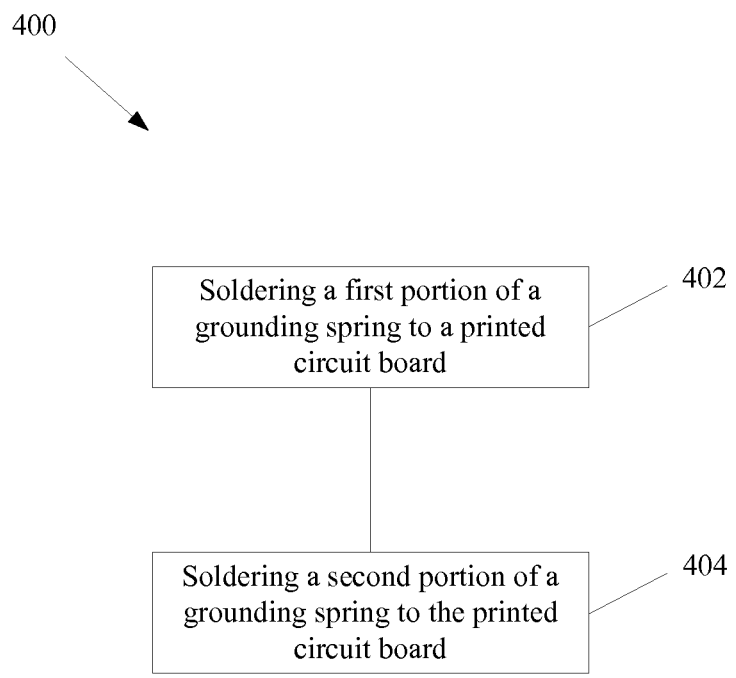
FIG. 4 shows a block diagram illustrating a method for coupling an overpass grounding spring to a printed circuit board.

FIG. 4 shows a block diagram illustrating a method 400 for attaching an overpass grounding spring to a PCB. In step 402 a first portion of the grounding spring is soldered to a solder pad disposed on the PCB. In step 404 a second portion of the grounding spring is soldered to an edge plated portion of the PCB, such that a third portion of the overpass disposed between the first and second portions passes over a number of components surface mounted to the PCB. In this way, several benefits can be realized. For example, components disposed between the soldered portions of the grounding spring can be electrically isolated from other components. Also, the second soldered portion increases a coupling strength between the grounding spring and the PCB. Further, grounding spring can be operable to provide mechanical protection for the surface mounted components. It should be noted that the above steps can be accomplished in series or in parallel. For example, the first and second portions of the grounding spring can be soldered to the PCB in a single soldering operation.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A single-piece multi-level grounding spring formed of an electrically conductive material and suitable for providing a ground to a circuit board having a top surface that includes a conductive pad and a component, the circuit board further comprising a bottom surface opposite the top surface, the circuit board further comprising an edge plate disposed on a lateral surface and operable to route a signal between the top and the bottom surface, the single-piece multi-level grounding spring comprising:
 a first portion extended laterally a first level, the first portion having a ground contact configured to electrically couple the circuit board with a chassis ground;
 a second portion extended laterally from the first portion at a second level different than the first level and configured to electrically connect to the conductive pad; and
 a third portion at a third level different than the first level and different from the second level, the third portion capable of covering the component;
 wherein the third portion comprises an overpass portion extends to a joint permanently attached with the edge plate.

2. The single-piece multi-level grounding spring of claim 1, wherein a width of the overpass portion is sufficient to cover an entire surface of the component.

3. The single-piece multi-level grounding spring of claim 2, wherein the width of the overpass portion is sufficient to cover a surface of a second component of the circuit board, the second component different from the component.

4. The single-piece multi-level grounding spring of claim 1, further comprising a side shield coupled with the overpass portion, the side shield capable of shielding the component from radio frequency emission.

5. The single-piece multi-level grounding spring of claim 4, wherein the side shield is perpendicular with respect to the overpass portion.

6. The single-piece multi-level grounding spring of claim 1, wherein the first portion comprises an L-shaped configuration that includes the ground contact.

7. A method for electrically grounding a circuit board having a conductive pad and an edge plate and protecting a component on the circuit board using a single-piece grounding spring, the method comprising:
 forming a ground contact configured to couple the circuit board with a ground chassis;
 forming a planar section extended laterally from the ground contact and elevated with respect to the ground contact and coupled with the circuit board at the conductive pad; and
 forming an overpass portion extended laterally from the planar section and elevated with respect to the planar section, the overpass portion having a size sufficient to cover a surface of the component; and
 forming a joint disposed between the planar section and the overpass portion, the joint configured to receive a force in response to a force provided to the ground contact, wherein the overpass portion extends to a second joint attached with the edge plate;
 wherein the overpass portion and the second joint are permanently attached with the edge plate.

8. The method of claim 7, further comprising forming an L-shaped configuration that includes the ground contact.

9. The method of claim 7, wherein a width of the overpass portion is sufficient to cover an entire surface of the component.

10. The method of claim 9, wherein the width of the overpass portion is sufficient to cover a surface of a second component of the circuit board, the second component different from the component.

11. The method of claim 7, further comprising coupling a side shield with the overpass portion, the side shield capable of shielding the component from radio frequency emission.

12. The method of claim 11, wherein the side shield is perpendicular with respect to the overpass portion.

13. A connector assembly comprising a circuit board and a single-piece grounding spring, the circuit board configured to receive the single-piece grounding spring that includes a ground contact, a planar section, an overpass portion, and a joint, the circuit board comprising:

a substrate comprising a first notch configured to receive a section of the single-piece grounding spring and allow the single-piece grounding spring to extend away from the substrate and carry the ground contact, the substrate further comprising a second notch opposite the first notch and configured to receive the joint of the single-piece grounding spring;

a solder pad disposed on the substrate, the solder pad electrically and mechanically coupling the planar portion of the single-piece grounding spring with the substrate;

a component electrically coupled with the substrate, the component overlaid by the overpass portion of the single-piece grounding spring when the single-piece grounding spring is coupled with the substrate at the first notch and the second notch; and an edge plate electrically coupled with the single-piece grounding spring at the joint.

14. The circuit board of claim 13, wherein the edge plate is operable to route signals between a top surface and a bottom surface of the substrate.

15. The circuit board of claim 13, wherein the edge plate electrically and mechanically couples the single-piece grounding spring with the substrate.

16. The circuit board of claim 13, wherein the component includes a top surface that is entirely overlaid by the single-piece grounding spring.

17. The circuit board of claim 13, wherein the component is shielded from radio frequency emission from a side shield coupled with the overpass portion.

* * * * *